(12) United States Patent
Barger et al.

(10) Patent No.: US 7,394,275 B1
(45) Date of Patent: Jul. 1, 2008

(54) SYSTEMS AND METHODS FOR GENERATING AND EVALUATING HIGH FREQUENCY, LOW VOLTAGE SWING SIGNALS AT IN-CIRCUIT TESTING

(75) Inventors: William J. Barger, Thorndale, PA (US); Thomas J. Kelleher, West Chester, PA (US); Mark A. Capriotti, Thornton, PA (US); Mark W. Jennion, Chester Springs, PA (US)

(73) Assignee: Unisys Corporation, Blue Bell, PA (US)

( * ) Notice: Subject to any disclaimer, the term of this patent is extended or adjusted under 35 U.S.C. 154(b) by 374 days.

(21) Appl. No.: 11/092,423

(22) Filed: Mar. 29, 2005

(51) Int. Cl.
*G01R 31/26* (2006.01)
*G01R 31/28* (2006.01)
(52) U.S. Cl. .................... 324/765; 324/158.1
(58) Field of Classification Search ............. 324/765
See application file for complete search history.

(56) References Cited

U.S. PATENT DOCUMENTS 4,439,858 A * 3/1984 Petersen ............ 714/734
6,381,269 B1 * 4/2002 Gradl et al. ............ 375/224
6,570,397 B2 * 5/2003 Mayder et al. .......... 324/754
2002/0121913 A1 * 9/2002 Miller et al. ........... 324/760
2004/0183517 A1 * 9/2004 Reilly et al. ......... 324/76.11

* cited by examiner

*Primary Examiner*—Ha Nguyen Ha
*Assistant Examiner*—Joshua Benitez
(74) *Attorney, Agent, or Firm*—Richard J. Gregson; Robert P. Marley; Woodcock Washburn LLP

(57) ABSTRACT

Systems and methods for testing components of printed circuit assemblies (PCA) that generate high frequency, low voltage swing signals or that operate using such signals are disclosed. High frequency, low voltage swing signals from the PCA are divided and translated to low frequency signals exhibiting voltage swings compatible with an in-circuit test platform for evaluation. Additionally, high frequency signals exhibiting voltage swings compatible with a PCA are generated. The signals are sent to the PCA for testing components. The division/translation or signal generation/translation logic may be bypassed, enabling the in-circuit test platform and the PCA to send signals between each other even if power to the system is off.

14 Claims, 4 Drawing Sheets

SYSTEMS AND METHODS FOR GENERATING AND EVALUATING HIGH FREQUENCY, LOW VOLTAGE SWING SIGNALS AT IN-CIRCUIT TESTING

FIELD OF THE INVENTION

The invention generally relates to the field of integrated circuits and specifically to testing components of printed circuit assemblies.

BACKGROUND OF THE INVENTION

In-circuit testing of printed circuit assemblies (PCA) electrically verifies component presence, correctness, orientation, and liveness as well as tests for shorted or open component pins. In-circuit test platforms may be, however, frequency and technology limited. For example, current in-circuit test platforms may detect the presence of a high frequency, low voltage swing clock (e.g., positive emitter coupled logic (PECL), high-speed transceiver logic (HSTL), low voltage differential signaling (LVDS) signals) but may not verify frequency. "Voltage swing" refers to a difference between the high and the low voltage of an input or output signal of a component. Additionally, current platforms may not be capable of supplying a high frequency, low voltage swing clock to test components of a PCA, such as phase-locked loops, under anticipated operating conditions.

While some in-circuit test platforms divide a high frequency clock so that it is within a range of the platform, the platform may be incapable of translating a signal to amplify, for example, a low voltage swing signal for reliable interpretation. Thus, in-circuit test platforms may be incapable of accurately evaluating a PECL, HSTL, or LVDS signal and also may be incapable of translating such signals to, for example, TTL for evaluation. Current tests may additionally be limited because testing logic (e.g., a divide circuit or a clock circuit) may prevent an in-circuit test platform from sending drive signals directly to a PCA to test components in the PCA. This prevents the in-circuit test platform from testing for solder shorts on clock nets before power is applied to the PCA as well as testing pins of other components connected to the clock nets using the same probes for receiving the clock.

In sum, in-circuit test platforms and and-on hardware such as the frequency isolator/divider boards by TestNet Inc., of Algonquin, Ill. may be unreliable when testing components such as oscillators, phase-locked loops, and other clock generators that supply high speed, low voltage swing signals (e.g., PECL, HSTL, LVDS signals). Therefore, a printed circuit assembly (PCA) may have functional or performance defects which are detected only after the PCA has reached downstream customers or users. The defects include frequency or amplitude defects and stuck-at faults. Overall, these clock defects are difficult to debug, divert time and energy away from design and verification, and create potential problems at the customer site.

Therefore, there is a need for efficiently detecting clock defects in printed circuit assemblies that include components that either generate high frequency, low voltage swing signals or operate using high frequency, low voltage swing signals.

SUMMARY OF THE INVENTION

The invention is directed to systems and methods for testing components of printed circuit assemblies (PCA) that generate high frequency, low voltage swing signals or that operate using such signals. According to one aspect, the invention provides for dividing high frequency signals received from a PCA under test to low frequency signals, and for translating signals exhibiting one type of voltage swing to a second type of voltage swing. The resulting low frequency signals exhibiting a second type of voltage swing are sent to an in-circuit test platform for evaluation.

According to another aspect, the invention provides for generating high frequency signals, translating the signals such that the swing is compatible with a PCA, and sending the signals to a PCA so that components that operate on high frequency signals exhibiting a particular voltage swing may be tested under anticipated operating conditions.

The invention also includes multiplexor or other switching technology to allow an in-circuit test platform to bypass division, clock generation, and translation logic and enable the in-circuit test platform and the PCA to send signals directly to each other. In this way, the in-circuit test platform may, for example, test for the presence of short or open circuits. Additionally, the bypass around the testing logic may be used even if power to the inventive system is off, thus adding protection to the PCA in the event, for example, that a short circuit is present. Providing this bypass allows the in-circuit tester to drive signals to and receive signals from a PCA under test, allowing direct net-to-net short testing to take place before power is applied to the assembly. The bypass additionally facilitates reduction of the risk of device damage in the event a short is present when power is applied. The bypass feature also allows the tester to test the source or load of the clock device under test.

DETAILED DESCRIPTION OF ILLUSTRATIVE EMBODIMENTS

As used herein, the term "voltage swing" refers to a difference between the minimum high and the maximum low voltage of a signal supplied by or used in a component, the term "low voltage swing" refers to a voltage swing of less than 1V (e.g. PECL, LVDS), and the term "high voltage swing" refers to a voltage swing of greater than 2V (e.g., TTL, CMOS). The term "high frequency" refers to a frequency greater than approximately 20 MHz, and the term "low frequency" refers to a frequency less than approximately 20 MHz.

Figure 1:
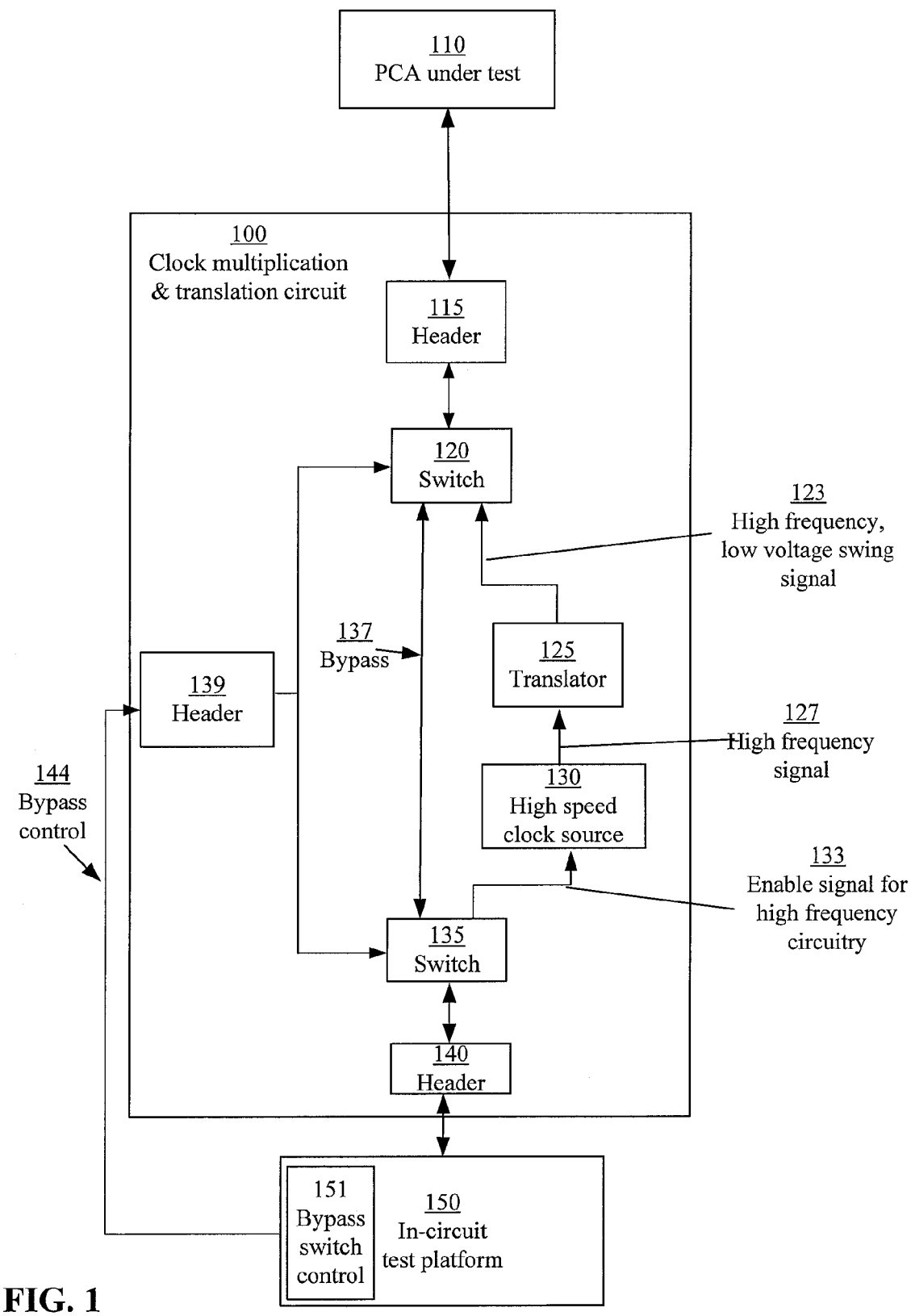
FIG. 1 & FIG. 1A each is a block diagram of one embodiment of a system for generating high frequency, low voltage swing signals at in-circuit testing, according to the invention.
Figure 1A:
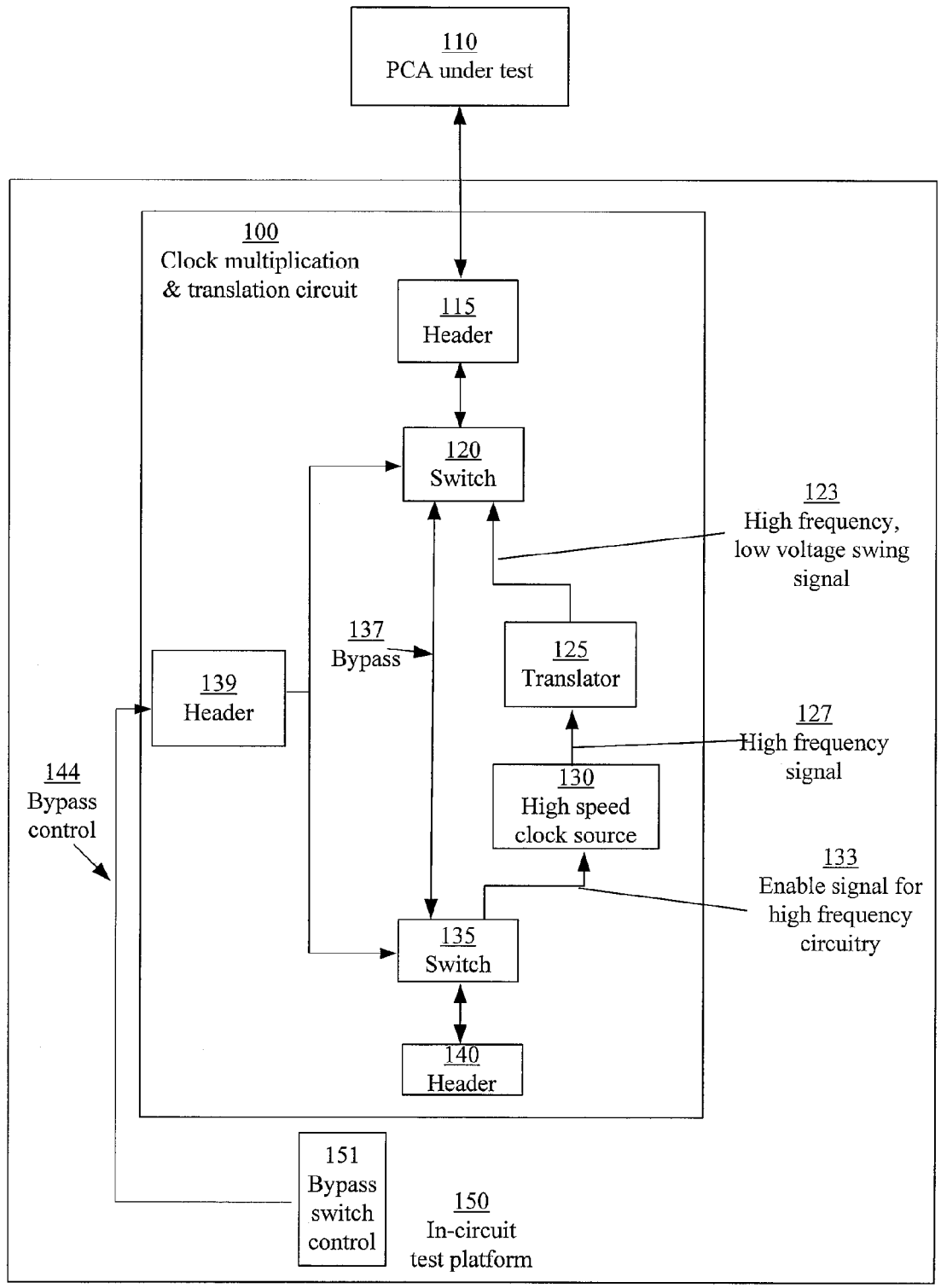

FIG. 1 is a block diagram of one embodiment of a system 100 for generating high frequency, low voltage swing signals at in-circuit testing, according to the invention. The system 100 augments an in-circuit test platform 150 and may be used by the in-circuit test platform 150 to supply a high frequency, low voltage swing clock to components of a printed circuit assembly (PCA) 110 during in-circuit testing of the PCA 110. The in-circuit test platform 150 may be any off-the-shelf or custom fabricated platform used to perform in-circuit testing of a PCA such as the PCA 110. While the system 100 is shown as an entity separate from the in-circuit test platform 150, it is understood that the system 100 may be incorporated into the in-circuit test platform 150, as depicted in FIG. 1A.

The PCA 110 may be any assembly comprising components for which in-circuit testing is desired. Such components may supply or operate on a high frequency or a low voltage swing clock (e.g., PECL, HSTL, or LVDS devices). The components may be, for example, phase-locked loops, oscillators, or other clock generators.

The system 100 comprises headers 115, 139, 140, switches 120, 135, a translator 125, and a clock source 130. The system 100 generally comprises two alternative signal paths. In a first path, a signal is sent from the in-circuit test platform 150, through the clock source 130 and the translator 125 and on to the PCA 110. The clock source 130 may be an off-the-shelf, high speed frequency generator such as a phase-locked loop or other appropriate device to provide a high frequency clock. A phase-locked loop may be configurable such that a control input or an enable signal 133 from the in-circuit test platform 150 may be set to select an appropriate output frequency. Alteratively, serial scanning of a command may be performed to select an appropriate output frequency. It will be understood that some phase-locked loops and frequency generators may require use of an external crystal oscillator.

A signal sent by the in-circuit test platform 150 may be sent to the clock source 130. Such a clock source 130 may be a 5V/3V programmable frequency synthesizer, part number SY89429, manufactured by Micrel, Inc., of San Jose, Calif. The signal may be an enable signal to select a high frequency signal 127 outputted from the clock source 130. The high speed signal 127 may be inputted into the translator 125.

The translator 125 may be an off-the-shelf technology translator for translating an input signal such as the signal 127 to a technology format compatible with the PCA 110. For example, the high speed signal 127 may be in a format that exhibits a voltage swing compatible with a LVTTL, TTL, or LVCMOS. The PCA 110 or a component of the PCA 110, however, may be compatible with a low voltage swing signal such as, for example, a PECL, LVDS, LVPECL or HSTL signal. The high speed signal 127 thus is inputted into the translator 125. The output of the translator 125 is a high speed, low voltage swing signal 123 compatible with the PCA. Thus, it will be understood that the inputs of the translator 125 may be compatible with the output of the clock source 130, and the output of the translator 125 may be compatible with the component on the PCA 110 that acts as an input for the system 100. Of course, it will be understood that in some cases, such as when the output of the clock source 130 is compatible with the PCA 110, a translator 125 may not be required.

The clock source 130 and the translator 125 thus provide a signal 123 to the PCA 110 or a component of the PCA 110 for simulating anticipated working conditions for the PCA 110. This allows components of the PCA 110 such as phase-locked loops, to be functionally tested to detect abnormalities prior to shipping to an end user or customer. It is understood that, if a component of the PCA 100 requires a voltage swing signal compatible with, for example, TL, LVTTL, CMOS, or LVCMOS, then a translator may be installed in the system 100 to provide such a signal to the PCA 110. Additionally, it is understood that the system 100 may comprise more than one clock source 130 or more than one translator 125, depending on the in-circuit test platform 150 and the PCA 110.

As described herein, the system 100 comprises two alternative signal paths. In addition to the signal path described above, the system 100 comprises the second path, through which a signal is sent directly between the in-circuit test platform 150 and the PCA 110 along a bypass path 137. That is, the in-circuit test platform 150 may send a signal directly to the PCA 110, and the PCA 110 may send a signal directly to the PCA 150. That is, the system 100 includes a bypass path 137 that allows for the clock source 130/translator 125 path to be disabled and provides direct electrical communication between the PCA 110 and the in-circuit test platform 150. The bypass path 137 enables the in-circuit test platform 150 to drive signals to and receive signals from the PCA 110 under test, allowing, for example, direct testing of a component in the PCA 110.

Additionally, the bypass path 137 enables the in-circuit test platform 150 and the PCA 110 to continue to transmit and receive signals through the system 100 when power to the system 100 is off. When the system 100 is in by-pass mode, the in-circuit test platform 150 is able to perform direct net-to-net short testing on the PCA 110 before power is applied to the PCA 110, reducing risk of damage in the event that there is a short circuit. The bypass path 137 also allows for the testing of a source or load of a component on the PCA 110.

The switches 120, 135 as well as the header 139 facilitate use of the bypass path 137. The switches 120, 135 each may comprise an off-the-shelf multiplexor or other component capable of being configured as a switch to provide for selection of one of the two paths (i.e., the bypass path 137 or the clock source 130/translator 125 path). Such a switch may be a low signal relay, part number G6K-2F-YDC3, manufactured by Omron Corp., Kyoto, Japan. The switches 120, 135 can be controlled by the in-circuit test platform 150, which is aware of the tests being performed and the required condition of the switches 120, 135 to facilitate the performance of the tests.

The header 139 is an interface that connects the in-circuit test platform 150, and specifically, bypass switch controls 151 of the platform 150, to the system 100 through bypass control path 144. The in-circuit test platform 150 controls the switching relays associated with the switches 120, 135 so that either the bypass path 137 or the clock source 130/translator 125 path is enabled. Additionally, the header 139 may be used by the in-circuit test platform 150 to provide power to the system 100. Alternatively, power to the system 100 may be supplied by the PCA 110.

The header 140 provides an interface between the system 100 and the in-circuit test platform 150. If the clock source 130/translator 125 path is enabled, then the in-circuit test platform 150 issues optional disable signals in the event that the in-circuit test platform 150 stops the clock. If the bypass path 137 is enabled, then the header 140 provides a direct connection from the in-circuit test platform 150 to the PCA 110.

The header 115 is an interface between the system 100 and the PCA 110. If the clock source 130/translator 125 path is enabled, then a high frequency, low voltage swing clock rill be sent to the PCA 110. If the bypass path 137 is enabled, then the header 115 will provide a direct connection between the PCA 110 and the in-circuit test platform 150.

Figure 2:
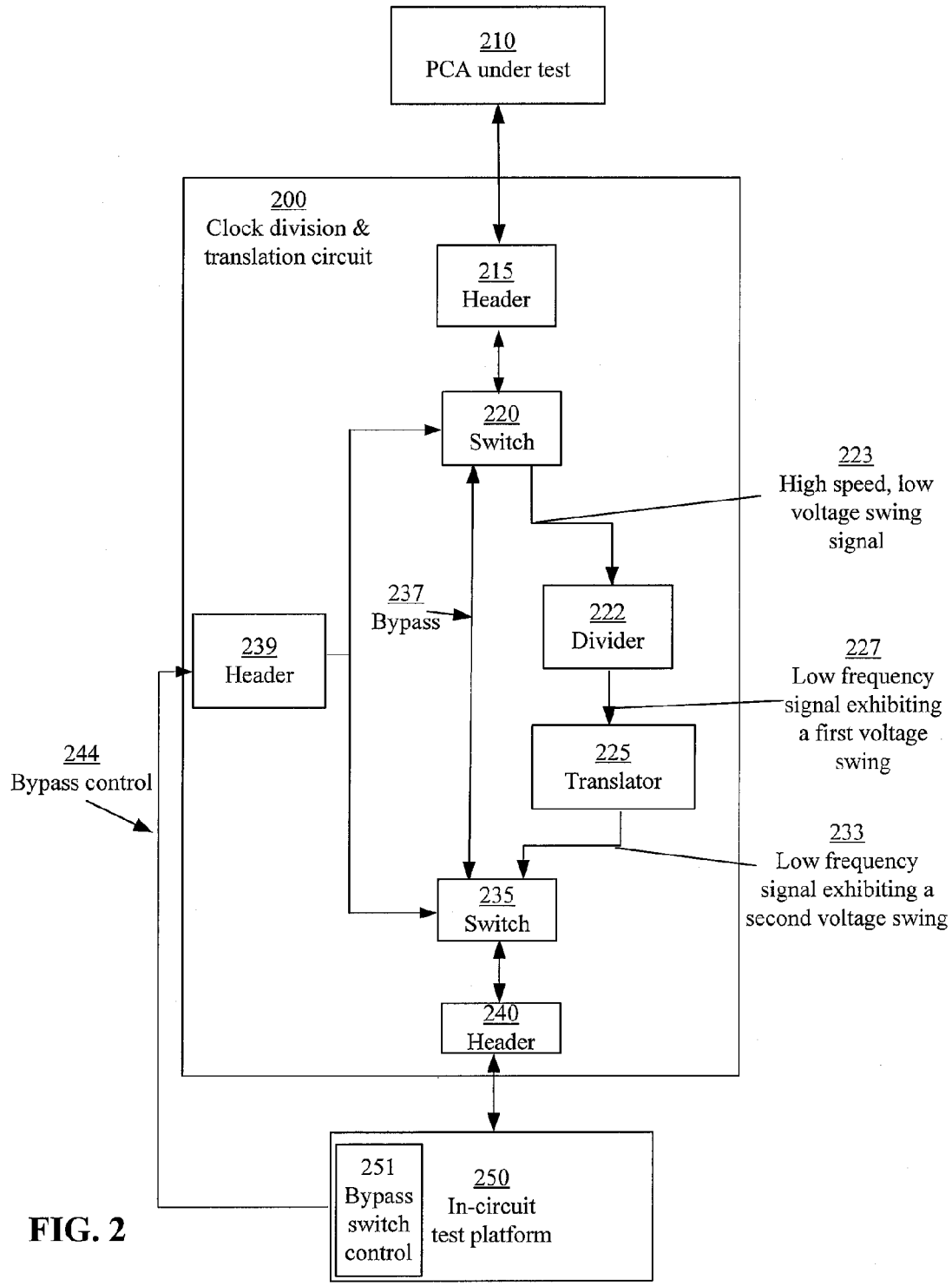
FIG. 2 is a block diagram of one embodiment of a system for evaluating high frequency, low voltage swing signals at in-circuit testing, according to the invention.

FIG. 2 is a block diagram of one embodiment of a system 200 for evaluating high frequency, low voltage swing signals at in-circuit testing, according to the invention. The system 200 is similar to the system 100 of FIG. 1, except that an in-circuit test platform 250 is receiving signals from a PCA 210, and the signals outputted from the PCA 210 are modified so that the in-circuit test platform 250 can evaluate them. The in-circuit test platform 250 and the PCA 210 may be essentially the same as the in-circuit test platform 150 and the PCA 110.

The system 200 comprises headers 215, 239. 240, switches 220, 235, a translator 225, and a divider 222. As with the system 100, the system 200 generally comprises two alternative signal paths. In a first path, a signal is sent from the PCA 210, through the divider 222 and the translator 225 and on to the in-circuit test platform 250. The divider 222 may be an off-the-shelf divider for converting a high speed, low voltage swing signal 223 sent by the PCA 210 to a low speed, low voltage swing signal 227. The divider may be a divide-by-2, -4, -8 clock generation chip, part number SY100EL34L, manufactured by Micrel, Inc., of San Jose, Calif. The divider may be configurable such that an appropriate divide ratio is selected. The low speed, low voltage swing signal 227 may be inputted into the translator 225.

The translator 225 may be an off-the-shelf technology translator of the same type as the translator 125. Alternatively, the translator 225 may be an ON semiconductor 3.3V dual differential LVPECL to LVTTL translator, part number MC100LVELT23, manufactured by Micrel, Inc., of San Jose. Calif. The translator 225 translates an input signal such as the signal 227 to a technology format that the in-circuit test platform 250 can evaluate. For example, the signal 227 may be in a PECL format. The in-circuit test platform 250, however, may be configured for LVDS, HSTL, TTL, LVTTL, CMOS, or LVCMOS, for example. Therefore, in accordance with the invention, the translator 225 converts the signal 227 into a format compatible with the in-circuit test platform 250. The output of the translator 225 is a low speed signal 233 exhibiting a voltage swing compatible with the in-circuit test platform 250. Such a voltage swing may be either a high or a low voltage swing. Thus, it will be understood that the inputs of the translator 225 may be compatible with the output of the divider 222. Additionally, the in-circuit test platform 250 is aware of the expected output from the translator 225, and thus verifies frequency of the signal outputted from the PCA. Of course, it will be understood that in some cases, such as when the output of the divider 222 is compatible with the in-circuit test platform 250, the system 200 may not include the translator 225.

The divider 222 and the translator 225 thus provide a signal 233 to the in-circuit test platform that is within an evaluation range of the in-circuit test platform. Therefore, if the PCA 210 includes components such as phase-locked loops or other components that generate a signal having a frequency (e.g.,. oscillators), the components may be functionally tested to detect abnormalities prior to shipping to an end user or customer. It is understood that the system 200 may include more than one divider 222 or more than one translator 225, depending on the in-circuit test platform 250 and the PCA 210.

As described, the system 200 includes two alternative signal paths. In addition to the signal path described above, the system 200 comprises the second path, through which a signal is sent directly between the PCA 210 and the in-circuit test platform 250 along a bypass path 237. That is, the in-circuit test platform 250 may send a signal directly to the PCA 210, and the PCA 210 may send a signal directly to the in-circuit test platform 250. The in-circuit test platform 250 may, through control of switches 220, 235 and use of the bypass switch controls 251, the bypass control path 244 and the header 239, enable and disable the bypass path in a manner essentially the same as described with regard to FIG. 1.

The switches 220, 235 each may be an off-the-shelf multiplexor or other component capable of being configured as a switch as described with regard to switches 120, 135. The header 239 is an interface that connects the in-circuit test platform 250 and specifically bypass switch controls 251 of the platform 250, to the system 200 through bypass control path 244, as described with regard to the header 139 of FIG. 1. The headers 215, 240 provide interfacing capability as described with regard to headers 115, 140.

Figure 3:
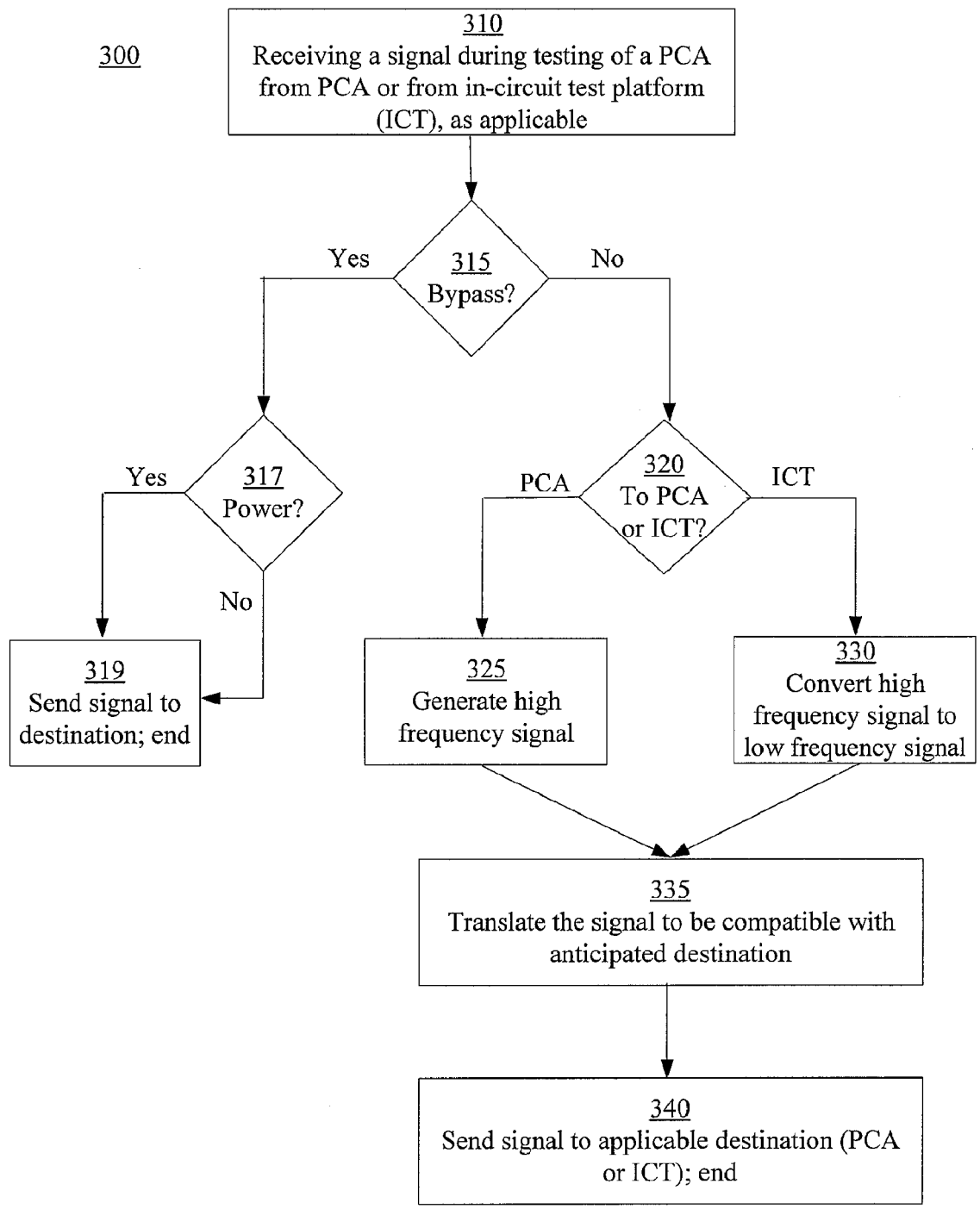
FIG. 3 is a flow diagram of one embodiment of a method for generating and evaluating high frequency, low voltage swing signals at in-circuit testing, according to the invention.

FIG. 3 is a flow diagram of one embodiment of a method 300 for generating and evaluating high frequency, low voltage swing signals at in-circuit testing, according to the invention. The method 300 starts at step 310 by receiving a signal during testing of a PCA. The signal may be received from either an in-circuit test platform or from the PCA. If a bypass is enabled at step 315, then the signal may be sent directly to the appropriate destination. If the signal is received from the PCA, then the signal is sent to an in-circuit test platform. If the signal is received from the in-circuit test platform, then the signal is sent to the PCA. At step 319, the signal may be sent to the destination regardless of whether, at step 317, power is provided to the system that received the signal at step 310.

If at step 315, the bypass is determined to be disabled, then the destination of the signal is determined at step 320. If at step 320, it is determined that the signal is destined for a PCA (i.e., the signal was received from an in-circuit test platform), then the signal may be used to generate a selected high frequency signal at step 325. Such a high speed signal may be generated using the clock source 130 described with regard to FIG. 1. If at step 320, it is determined that the signal is destined for the in-circuit test platform, then the signal may be converted from a high frequency to a low frequency signal at step 330. Such conversion may be completed by the divider 222 described with regard to FIG. 2. At step 335, either the high frequency signal generated at step 325 or the low frequency signal generated at step 330 may be translated to be compatible with the anticipated destination (i.e., either the PCA or the in-circuit test platform). If the signal is destined for the PCA, then the voltage swing of the high frequency signal is converted such that it is compatible with the PCA. If the signal is destined for the in-circuit test platform, then the low voltage swing of the low frequency signal is converted such that it is compatible with the in-circuit test platform. Such conversion may be completed by the translator 125, 225, described with regard to FIGS. 1 and 2, respectively. At step 340, the signal is sent to the applicable destination, and appropriate testing and evaluation may be completed.

In the foregoing description, it can be seen that the present invention comprises new and useful systems and methods for generating and evaluating high frequency, low voltage swing signals at in-circuit testing. It should be appreciated that changes could be made to the embodiments described above without departing from the inventive concepts thereof It should be understood, therefore, that this invention is not limited to the particular embodiments disclosed, but it is intended to cover modifications ,within the spirit and scope of the present invention as defined by the appended claims.

What is claimed is:

1. A system, comprising:
    a translator for electrically connecting an in-circuit test platform with a printed circuit assembly, the translator translating a signal having a first voltage swing to a signal having a second voltage swing;
    a bypass path for electrically connecting the in-circuit test platform with the printed circuit assembly; and
    a switch for selectively transmitting a signal sent by the in-circuit test platform through either the translator or the bypass path.

2. The system of claim 1, further comprising:
    a clock source electrically connected to the translator that outputs a signal exhibiting the first voltage swing and having a high frequency.

3. The system of claim 2, wherein the output signal of the clock source is input to the translator.

4. The system of claim 2, wherein the clock source comprises a phase-locked loop.

5. The system of claim 2, wherein the clock source has an input for receiving a signal from the in-circuit test platform.

6. The system of claim 1, wherein the second voltage swing of the signal outputted from the translator is compatible with a component of the printed circuit assembly.

7. The system of claim 6, wherein the second voltage swing comprises a low voltage swing.

8. The system of claim 1, wherein the switch comprises a multiplexor.

9. The system of claim 1, wherein the system is embodied as part of the in-circuit test platform.

10. The system of claim 1, wherein the switch is controlled by the in-circuit test platform.

11. The system of claim 1, wherein the printed circuit assembly and the in-circuit test platform communicate via the bypass path when power to the translator is off.

12. The system of claim 1, wherein the bypass path facilitates testing for short or open circuits in the printed circuit assembly when power to the translator is off.

13. The system of claim 1, wherein the system is an in-circuit testing system for testing a component of the printed circuit assembly for proper operation, wherein the component receives or generates signals having an oscillating signal.

14. The system of claim 1, further comprising:
a bypass switch control; and
a header for providing an interface between the in-circuit test platform and the bypass switch control.

* * * * *